United States Patent [19]

Heeren et al.

[11] 4,317,276

[45] Mar. 2, 1982

[54] METHOD OF MANUFACTURING AN INSULATED GATE FIELD-EFFECT TRANSISTOR THEREFORE IN A SILICON WAFER

[75] Inventors: Richard H. Heeren, Palatine; Herbert A. Waggener, Mundelein, both of Ill.

[73] Assignee: Teletype Corporation, Skokie, Ill.

[21] Appl. No.: 158,680

[22] Filed: Jun. 12, 1980

[51] Int. Cl.³ .................. H01L 21/225; H01L 21/283
[52] U.S. Cl. ...................................... 29/571; 29/578; 29/590; 29/591; 148/187; 148/188; 357/23; 357/59; 357/71
[58] Field of Search .............. 29/571, 578, 590, 591; 148/187, 188; 357/23, 59, 71

[56] References Cited

U.S. PATENT DOCUMENTS

| | | | |
|---|---|---|---|
| 3,479,234 | 11/1969 | Gray | 29/571 X |
| 3,541,676 | 11/1970 | Brown | 29/571 |
| 3,574,010 | 4/1971 | Brown | 148/188 X |
| 3,747,200 | 7/1973 | Rutledge | 29/571 |
| 4,041,518 | 8/1977 | Shimizu et al. | 148/188 X |
| 4,160,683 | 7/1979 | Roche | 148/188 X |
| 4,192,059 | 3/1980 | Khan et al. | 29/571 |
| 4,219,925 | 9/1980 | Heeren | 29/578 |

Primary Examiner—R. Dean
Assistant Examiner—W. G. Saba

Attorney, Agent, or Firm—W. K. Serp; J. C. Albrecht

[57] ABSTRACT

A method of manufacturing a device in a wafer with a P-type semiconductor, includes forming on a surface of the semiconductor body a layer of silicon dioxide doped with an N-type dopant. The portion of the doped silicon dioxide covering the interconnect work site area is removed and a masking layer of an oxidation impervious medium is formed over the wafer and thereafter removed from the field areas, as is the doped silicon dioxide layer. A thin layer of gate oxide is formed over the field areas. A layer of conductive polysilicon is formed over the entire wafer followed by a layer of oxygen impervious masking medium. The conductive polysilicon and masking medium layers are removed from all areas of the wafer except those whereat transistors are to be formed. The wafer is exposed to an oxidizing environment under an elevated temperature producing a field oxide over the exposed gate oxide. The elevated temperature of this operation drives the dopant in the doped silicon oxide layer into the semiconductor body forming doped source/drain regions and doped first level conductor runs. Thereafter the masking medium covering the interconnect work site area is removed and the work site area diffused with an N-type dopant. Finally, second level conductor runs are formed on the wafer.

7 Claims, 12 Drawing Figures

METHOD OF MANUFACTURING AN INSULATED GATE FIELD-EFFECT TRANSISTOR THEREFORE IN A SILICON WAFER

TECHNICAL FIELD

This invention relates to a method of manufacture of an insulated gate field-effect transistor (IGFET) and to the structure of such a device.

BACKGROUND ART

Integrated circuits which utilize IGFETs are generally evaluated on the basis of frequency response and the degree of economical utilization of semiconductor surface area.

Both frequency performance and surface area requirements are determined by the method of manufacture of the circuitry in the semiconductor. The manufacturing methods in current use include successive masking steps each being followed by a photoshaping operation. Many of these methods require that the successive masks be accurately aligned to obtain minimum surface area. The alignment of successive masks is difficult to control and usually an additional amount of semiconductor surface area is allotted in recognition of attainable tolerances in mask alignment. Cost and semiconductor surface area savings may be obtained by those methods which reduce or eliminate critical mask alignments i.e., include self-alignment features in the formation of source/drain, interconnect, gate, and conductor areas of the circuitry. Additionally, the resulting reduction in circuit size realized through self-aligning features improves the frequency response of the circuitry.

SUMMARY OF THE INVENTION

This invention is a method of manufacturing a device in a wafer with a semiconductor body of a first conductivity type. The method is characterized by the following steps:

A. forming on a surface of the semiconductor body a layer of silicon dioxide doped with a second conductivity type dopant,
B. removing that portion of the doped silicon dioxide covering the interconnect work site area of the wafer,
C. forming a masking layer of an oxidation impervious medium over the wafer,
D. removing the oxidation impervious masking layer from the field areas of the wafer,
E. removing the doped silicon dioxide layer from the field areas of the wafer so that multilayers of doped silicon dioxide and oxidation impervious medium overlay the source/drain and first level conductor areas of the wafer and a single layer of the oxidation impervious medium overlays the interconnect work site area of the wafer,
F. forming a layer of gate oxide over the gate area of the wafer,
G. forming a layer of conductive material over the entire surface of the wafer,
H. forming a layer of an oxidation impervious masking medium over the entire surface of the wafer.
I. removing the conductive material formed in Step G and the oxidation impervious masking medium in Step H from all areas of the wafer except the gate area of the wafer,
J. exposing the wafer to an elevated temperature so as to drive the dopant in the doped silicon dioxide layer formed in Step A into the underlying semiconductor thus forming doped source/drain diffusion and doped first level conductor diffusions,
K. removing the masking medium formed in Step C from the interconnect work site area,
L. doping the interconnect work site area with a second conductivity type dopant,
M. forming a conductor over the entire surface of the wafer, and
N. removing the conductor from all undesired portions of the wafer surface to form a desired pattern of electrical interconnections.

THE DRAWINGS

FIGS. 1 through 12 inclusive, illustrate selected steps during the fabrication of an insulated gate field-effect transistor (IGFET) in accordance with a preferred embodiment of the invention.

DETAILED DESCRIPTION

The method hereinafter described utilizes a wafer 20 having a P-type silicon body 22 doped with N-type impurities as the dopant at the source/drain areas, that is, N-channel technology. However, it will be appreciated that the method may also be used with P-channel technology.

Figure 1:
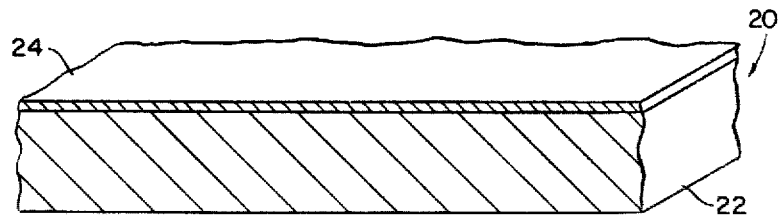
Figure 2:
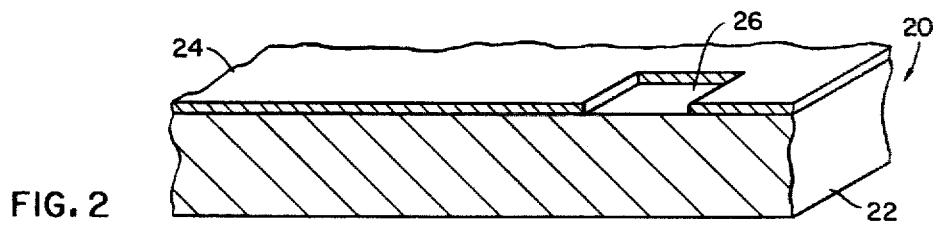
Figure 3:
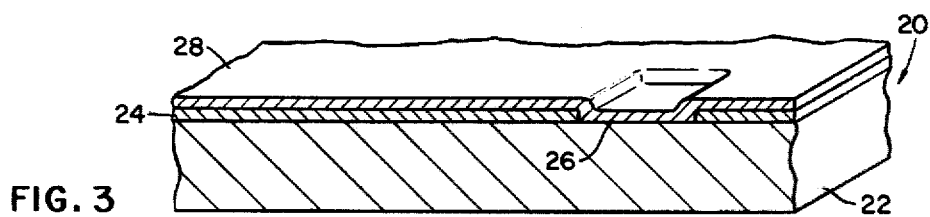
Figure 4:
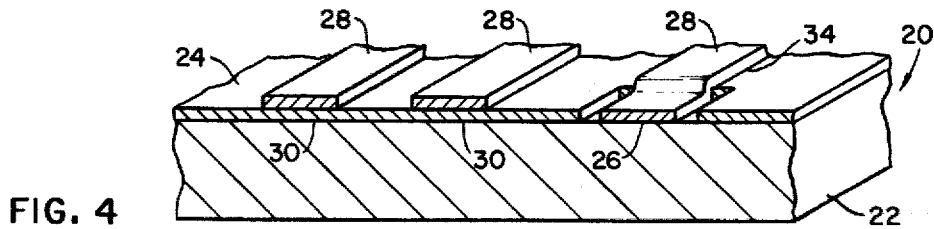
Figure 5:
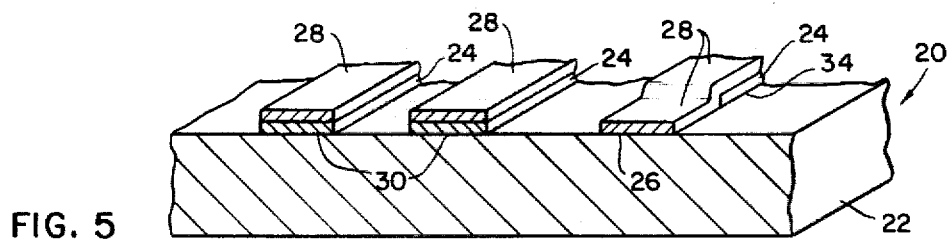

As a first step, the wafer 20 is covered with a layer of silicon dioxide 24 doped with an N-type dopant. Thereafter, the wafer 20 is covered with a photoresist material and a first lithographic mask defines the interconnect work site area 26 on the surface of the wafer 20. As shown in FIG. 2, the wafer 20 is photoshaped to expose the semiconductor body 22 at the interconnect work site area 26. In the following operation (FIG 3), an oxidation impervious masking medium 28 such as silicon nitride ($Si_3N_4$) is placed over the entire surface of the wafer 20. In the next operation, the wafer 20 is again coated with photoresist and a second mask defines the source/drain areas 30, the interconnect work site area 26 and the area of the first level conductor run 34. The surface of the wafer 20 is photoshaped to remove the unprotected silicon nitride masking medium 28 resulting in the configuration of FIG. 4. The source/drain areas 30, interconnect work site 26 and the first level conductor run area 34 remain covered with the masking medium 28. It will be appreciated that the first and second masks do not define common boundaries. The first mask defines two parallel edges of the interconnect work site area 26 and the second mask defines the remaining two edges of the interconnect work site area 26 as well as the source/drain areas 30 and first level conductor run area 34. Thus, both masks are self-aligning. In the following step (FIG. 5), the doped silicon oxide layer 24 is selectively etched from the surface of the semiconductor body with the masking medium layer 28 serving as an etchant barrier. A sandwich layer of doped oxide 24 and silicon nitride 28 remains over the source/drain areas 30 and first level conductor run area 34 and a single layer of silicon nitride 28 remains over the interconnect work site area 26.

Figure 6:
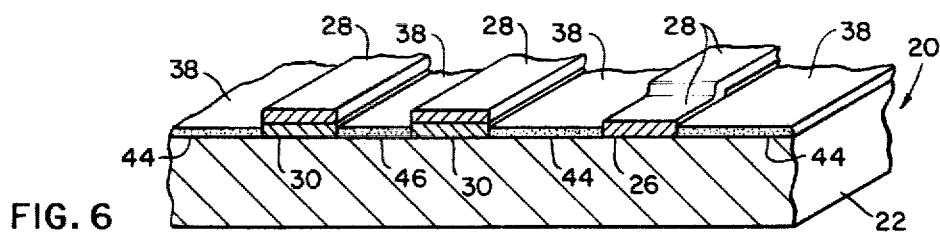
Figure 7:
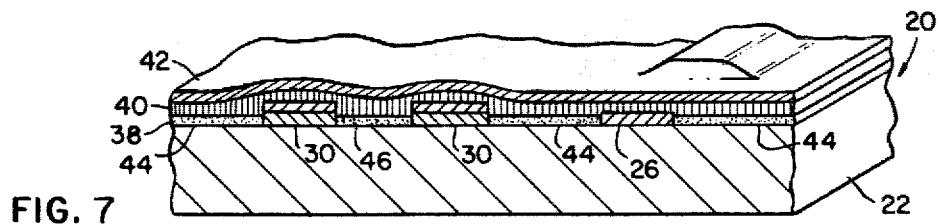
Figure 8:
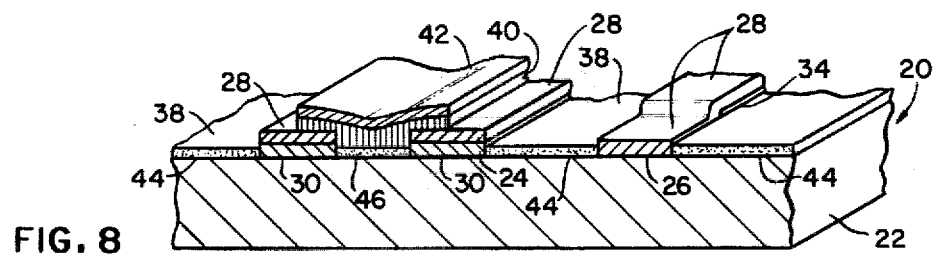

In the operation illustrated in FIG. 6, a thin gate oxide 38 is formed over the surface of the exposed semiconductor body 22 covering field 44 and gate 46 areas. Subsequently, as illustrated in FIG. 7, a layer of conductive polysilicon 40 is formed over the entire surface of the wafer 20 and over the polysilicon layer 40 is formed a masking medium layer 42 such as silicon nitride which serves as an oxidation barrier in subsequent operations. As will be more fully appreciated, a portion of the conductive polysilicon layer 40 serves as a gate electrode in the completed transistor. In the following operation of FIG. 8, a third mask is applied to the wafer 20 which generally delineates the areas occupied by the transistor i.e., the source/drain areas 30 and gate area 46. The silicon nitride layer 42 as well as the conductive polysilicon layer 40 are selectively removed by suitable etchants from the surface of the wafer 20 except at the transistor location. The placement of the third mask is relatively non-critical, the only requirement being that the gate area 46 must be fully masked. Preferably, the layers 40 and 42 terminate at the edge of the source/drain areas 30. However, to provide acceptable alignment tolerances the layers 40 and 42 are shown with some overlap of the source/drain areas 30.

Figure 9:
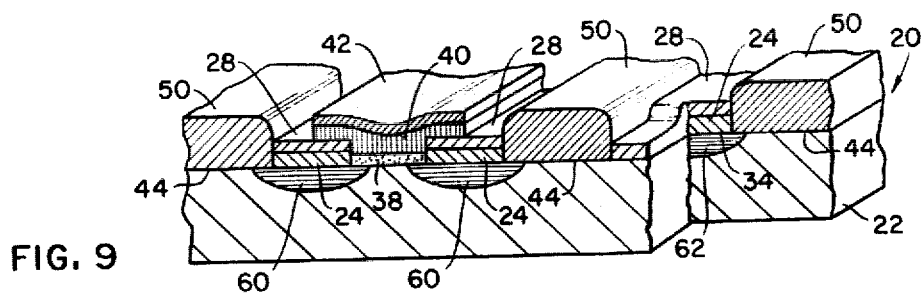
Figure 10:
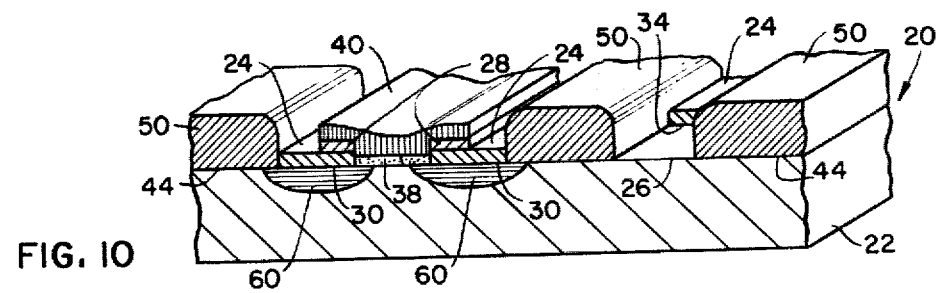
Figure 11:
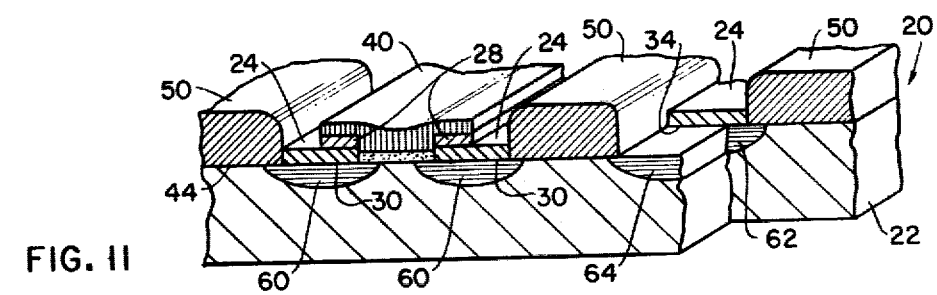
Figure 12:
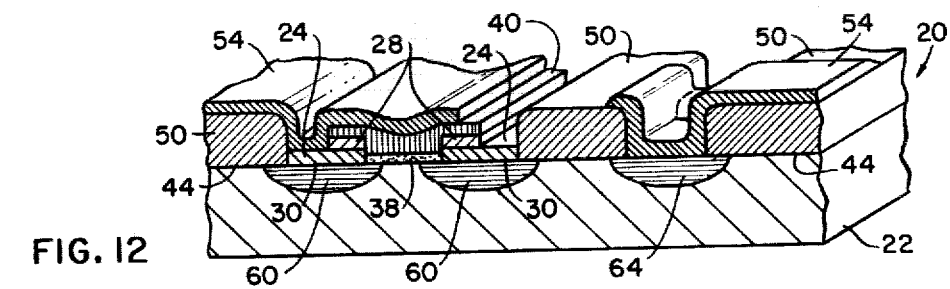

In the following operation (FIG. 9), the wafer 20 is exposed to an oxidizing environment under elevated temperature conditions producing a field oxide growth 50 over the exposed gate oxide 38 which covers the field areas 44 of the wafer 20. The new oxide growth 50 merges with the gate oxide 38 in the field areas 44. When subjected to the high temperature incurred during this oxidation step, the dopant in the remaining portions of the doped oxide layer 24 is driven into the semiconductor body 22 forming the source/drain N-type diffusions 60 as well as an N-type conductive diffusion 62 in the area of the first level conductor run 34. In the next operation (FIG. 10), the exposed portions of the nitride masking medium 28, overlying the source/drain areas 30, interconnect work site area 26 and conductor diffusion 62 are removed by a selective etchant thus exposing the semiconductor body at the interconnect work site area 26. Thereafter, as shown in FIG. 11, the interconnect work site area 26 is diffused with an N-type dopant producing a diffusion 64. It will be appreciated that the first level conductor diffusion 62, which terminated at the interconnect work site area 26 was doped during the preceding operation and merges with the work site diffusion 64 resulting in a continuous conductive path. As a first operation, the wafer 20 is covered with a conductive layer such as aluminum or conductive polysilicon. The conductive layer is photo-shaped utilizing a fifth mask to define second level conductor runs 54, providing electrical contact with the gate electrode 40 and the interconnect work site diffusion 64. It will be appreciated that none of the previously described masking operations require critical alignment since sequential masks do not define common boundaries and are therefore considered to be self-aligning.

Although this invention has been particulary shown and described with reference to a preferred implementation thereof, it should be understood that various changes and detail may be made without departing from the scope and spirit of the invention.

What is claimed is:

1. A method of manufacturing a device in a wafer with a semiconductor body of a first conductivity type, characterized by:

A. forming on a surface of the semiconductor body a layer of silicon dioxide doped with a second conductivity type dopant, B. removing that portion of the doped silicon dioxide covering the interconnect work site area of the wafer.

C. forming a masking layer of an oxidation impervious medium over the wafer,

D. removing the oxidation impervious masking layer from the field areas of the wafer, E. removing the doped silicon dioxide layer from field areas of the wafer so that multilayers of doped silicon dioxide and oxidation impervious medium overlay the source/drain areas and first level conductor areas of the wafer and a single layer of the oxidation impervious medium overlays the interconnect work site area of the wafer, F. forming a layer of gate oxide over the gate area of the wafer, G. forming a layer of conductive material over the entire surface of the wafer.

H. forming a layer of an oxidation impervious masking medium over the entire surface of the wafer, I. removing the conductive material formed in Step G and the oxidation impervious masking medium in Step H from all areas of the wafer except the gate area of the wafer, J. exposing the wafer to an elevated temperature so as to drive the dopant in the doped silicon dioxide layer formed in Step A into the underlying semiconductor body thus forming doped source/drain diffusions and doped first level conductor diffusions, K. removing the masking medium formed in Step C from the interconnect work site area, L. doping the interconnect work site area with a second conductivity type dopant, M. forming a conductor over the entire surface of the wafer, and P1 N. removing the conductor formed in Step M from all undesired portions of the wafer surface to form a desired pattern of electrical interconnections.

2. The method of claim 1 which is further characterized by:

O. exposing the wafer to an oxidizing atmosphere during Step J so as to form a field oxide over the field areas of the wafer.

3. The method of claim 2 which is further characterized by:

P. the oxidation impervious medium formed in Step C being silicon nitride,

Q. the oxidation impervious medium formed in Step H being silicon nitride.

4. The method of claim 2 which is further characterized by:

R. the conductive material formed over the surface of the wafer in Step G is conductive polysilicon.

5. The method of claim 4 which is further characterized by:

S. the oxidation impervious material formed in Step C being silicon nitride,

T. the oxidation impervious material formed in Step H being silicon nitride.

6. The method of claim 1 further characterized by:

U. The gate oxide of Step F is also formed over the field areas of the wafer.

7. The method of claim 6 further characterized by:

V. exposing the wafer to an oxidizing atmosphere in Step J so as to form a field oxide over the field areas of the wafer.

* * * * *